US010043670B2

(12) United States Patent
Ramalingam et al.

(10) Patent No.: US 10,043,670 B2
(45) Date of Patent: Aug. 7, 2018

(54) SYSTEMS AND METHODS FOR LOW RESISTIVITY PHYSICAL VAPOR DEPOSITION OF A TUNGSTEN FILM

(71) Applicant: APPLIED MATERIALS, INC., Santa Clara, CA (US)

(72) Inventors: Jothilingam Ramalingam, Sunnyvale, CA (US); Thanh X. Nguyen, San Jose, CA (US); Zhiyong Wang, Sunnyvale, CA (US); Jianxin Lei, Fremont, CA (US); Xianmin Tang, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/981,190

(22) Filed: Dec. 28, 2015

(65) Prior Publication Data
US 2017/0117153 A1 Apr. 27, 2017

Related U.S. Application Data

(60) Provisional application No. 62/245,050, filed on Oct. 22, 2015.

(51) Int. Cl.
*H01L 21/285* (2006.01)
*H01L 21/326* (2006.01)
(Continued)

(52) U.S. Cl.
CPC ........ *H01L 21/2855* (2013.01); *C23C 14/185* (2013.01); *C23C 14/345* (2013.01);
(Continued)

(58) Field of Classification Search
CPC ................. H01L 21/2855; H01L 21/326
See application file for complete search history.

(56) References Cited

U.S. PATENT DOCUMENTS 5,693,203 A * 12/1997 Ohhashi .............. C23C 14/3407
204/298.12
6,274,484 B1 8/2001 Tsai et al.
(Continued)

FOREIGN PATENT DOCUMENTS

JP 2002-371301 A 12/2002

OTHER PUBLICATIONS

International Search Report and Written Opinion dated Jan. 31, 2017 for PCT Application No. PCT/US2016/058134.

*Primary Examiner* — Kyoung Lee
*Assistant Examiner* — Christina Sylvia
(74) *Attorney, Agent, or Firm* — Moser Taboada; Alan Taboada (57) ABSTRACT

Systems and methods for sputtering a layer of refractory metal layer onto a barrier layer disposed on a substrate are disclosed herein. In one or more embodiments, a method of sputter depositing a tungsten structure in an integrated circuit includes: moving a substrate into a plasma processing chamber and onto a substrate support in opposition to a sputter target assembly comprising a tungsten target having no more than ten parts per million of carbon and no more than ten parts per million of oxygen present as impurities; flowing krypton into the plasma processing chamber; and exciting the krypton into a plasma to deposit, by sputtering, a tungsten film layer on a material layer of a substrate supported by the substrate support. In some embodiments, the target assembly further includes a titanium backing plate and an aluminum bonding layer disposed between the titanium backing plate and the tungsten target.

11 Claims, 7 Drawing Sheets

(51) Int. Cl.
  *C23C 14/18* (2006.01)
  *C23C 14/34* (2006.01)
  *C23C 14/35* (2006.01)
  *C23C 14/56* (2006.01)

(52) U.S. Cl.
  CPC .......... *C23C 14/3407* (2013.01); *C23C 14/35* (2013.01); *C23C 14/568* (2013.01); *H01L 21/326* (2013.01)

(56) References Cited

U.S. PATENT DOCUMENTS

| | | |
|---|---|---|
| 8,558,299 B2 | 10/2013 | Cao et al. |
| 8,894,827 B2 | 11/2014 | Jiang et al. |
| 2004/0149565 A1 | 8/2004 | Heinz et al. |
| 2006/0144703 A1* | 7/2006 | Yang ................... H01J 37/3405 204/298.16 |
| 2009/0053882 A1* | 2/2009 | Wang .................. C23C 14/0641 438/592 |
| 2011/0094879 A1 | 4/2011 | Suzuki et al. |
| 2014/0042016 A1 | 2/2014 | Cao et al. |
| 2015/0028302 A1 | 1/2015 | Lee et al. |

\* cited by examiner

SYSTEMS AND METHODS FOR LOW RESISTIVITY PHYSICAL VAPOR DEPOSITION OF A TUNGSTEN FILM

CROSS-REFERENCE TO RELATED APPLICATIONS

This application claims benefit of U.S. provisional patent application Ser. No. 62/245,050, filed Oct. 22, 2015, which is herein incorporated by reference in its entirety.

FIELD

Embodiments of the present disclosure generally relate to substrate processing systems.

BACKGROUND

The electrically-conductive interconnect layers of modern integrated circuits are generally of very fine pitch and high density. A single, small defect in the precursor metal film which ultimately forms a metallic interconnect layer of an integrated circuit can be so positioned as to seriously damage the operational integrity of the integrated circuit.

Metal films of integrated circuits are typically formed by physical vapor deposition (PVD) or chemical vapor deposition (CVD). One PVD approach uses a DC magnetron apparatus such, for example, as the Endura® system available from Applied Materials Inc. of California. In a DC magnetron apparatus of the aforementioned type, on bombardment of a metal or metal alloy target causes atoms or molecules of the target material to be sputtered onto a substrates.

Although PVD systems can produce high quality metal films with relatively low defect densities, the inventors herein have observed that the degree of bit line miniaturization which can be achieved by such systems is determined, to a significant degree, by the resistivity of the metal films.

SUMMARY

Systems and methods for sputtering a layer of refractory metal layer onto a barrier layer disposed on a substrate are disclosed herein. In one or more embodiments, a method of sputter depositing a tungsten structure in an integrated circuit includes: moving a substrate into a plasma processing chamber and onto a substrate support in opposition to a sputter target assembly comprising a tungsten target having no more than ten parts per million of carbon and no more than ten parts per million of oxygen present as impurities; flowing krypton into the plasma processing chamber; and exciting the krypton into a plasma to deposit, by sputtering, a tungsten film layer on a material layer of a substrate supported by the substrate support. In some embodiments, the target assembly further includes a titanium backing plate and an aluminum bonding layer disposed between the titanium backing plate and the tungsten target.

In some embodiments, a target for use in a plasma processing chamber in accordance with one or more embodiments consistent with the present disclosure includes: a sputter target assembly comprising a tungsten target having no more than five parts per million of carbon and no more than ten parts per million of oxygen present as impurities.

A plasma processing chamber constructed in accordance with one or more embodiments consistent with the present disclosure comprises a sputter target assembly comprising a tungsten target having no more than ten parts per million of carbon and no more than ten parts per million of oxygen present as impurities, the tungsten target having a first surface that is in contact with a processing region and a second surface that is opposite the first surface. The plasma processing chamber further includes a substrate support having a substrate receiving surface disposed below the tungsten target, a DC power supply coupled to the tungsten target, an RF power supply coupled to the substrate support, and a magnetron disposed adjacent to the second surface of the target, the magnetron including an outer pole comprising a plurality of magnets and an inner pole comprising a plurality of magnets, wherein the outer and inner poles form a closed-loop magnetron assembly and wherein the outer pole and the inner pole each create a magnetic field. In an embodiment, the target assembly further includes a titanium backing plate and an aluminum bonding layer disposed between the titanium backing plate and the tungsten target.

Additional embodiments and features are set forth in part in the description that follows, and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification.

BRIEF DESCRIPTION OF THE DRAWINGS

A further understanding of the nature and advantages of the disclosed embodiments may be realized by reference to the remaining portions of the specification and the drawings. The appended drawings illustrate only exemplary embodiments consistent with the appended disclosure and are not to be considered limiting, for the disclosure may admit to other; equally effective embodiments.

To facilitate understanding, identical reference numerals have been used, where possible, to designate identical elements that are common to the figures. The figures are not drawn to scale and may be simplified for clarity. Moreover, elements and features of one embodiment may be beneficially incorporated in other embodiments consistent with the present disclosure without further recitation.

DETAILED DESCRIPTION

Embodiments consistent with the present disclosure generally provide structures which include one or more low-resistivity features formed from a thin film refractory metal such, for example, as tungsten, as may be implemented in a gate electrode stack or in bitline structures, and include methods and apparatuses of forming the same. By way of example, a gate electrode stack structure formed in accordance with embodiments of the present disclosure may be a memory type semiconductor device, such as a DRAM type integrated circuit.

Figure 1A:
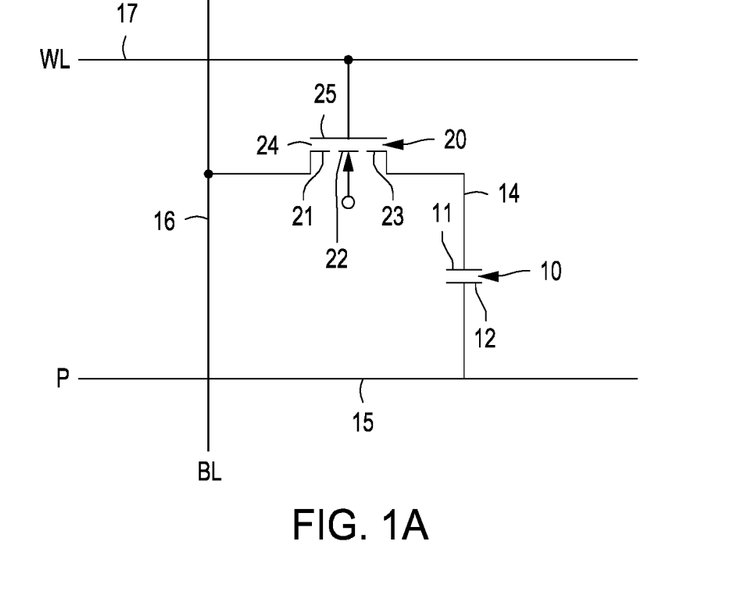
FIG. 1A illustrates a circuit diagram of a dynamic memory cell in a DRAM memory having improved properties in accordance with one or more embodiments of the present disclosure.

Turning now to FIG. 1A, a circuit diagram of a one transistor cell such as may be used in DRAM memories is illustrated. Another example of a transistor memory cell suitable for modification in accordance with the present disclosure is described in U.S. Patent Application Publication 2014/00420151 by Cao et al., published on Feb. 13, 2014 and assigned to Applied Materials Inc, of Santa Clara, Calif. The transistor memory cell depicted in FIG. 1A comprises a storage capacitor 10 and a selection transistor 20. The selection transistor 20 is formed as a field effect transistor and has a first source/drain electrode 21 and a second source drain electrode 23 between which an active region 22 is arranged. Above the active region 22 are the gate insulating layer or dielectric layer 24 and gate electrode 25, together which act like a plate capacitor and can influence the charge density in the active region 22 in order to form or block a current conducting channel between the first source/drain electrode 21 and the second source/drain electrode 23.

The second source/drain electrode 23 of the selection transistor 20 is connected to a first electrode 11 of the storage capacitor 10 via a connecting line 14. A second electrode 12 of the storage capacitor 10 is in turn connected to a capacitor plate 15 which may be common to storage capacitors of the DRAM memory cell arrangement. The first source/drain electrode 21 of the selection transistor 20 is furthermore connected to a bit line 16 in order that the information stored in a storage capacitor 10 in the form of charges can be written in and read out. The write in or read out operation is controlled via a word line 17 which is connected to the gate electrode 25 of the selection transistor 20. The write in or read out operation occurs by applying a voltage to produce a current conducting channel in the active region 22 between the first source/drain electrode 21 and the second source/drain electrode 23.

Different types of capacitors may be used as the storage capacitor 10 in DRAM type memory cells such as trench capacitors, stacked capacitors, and planar capacitors. With increasing miniaturization of the DRAM type memory cells and decreasing cross-sections of the trench capacitor, reduction of the RC time constant of a circuit e.g. a MOS device of a DRAM type memory cell becomes beneficial. The RC time constant is the time associated with charging the capacitor through the resistor to a percentage of full charge or to discharge the capacitor to a fraction of the initial voltage. The RC time constant is equal to the product of the circuit resistance and the circuit capacitance. The gate electrode is one contributor to the circuit resistance. Thus, one way to reduce the RC time constant of a MOS device in a DRAM type memory cell may be to reduce the resistance of the gate electrode.

Figure 1B:
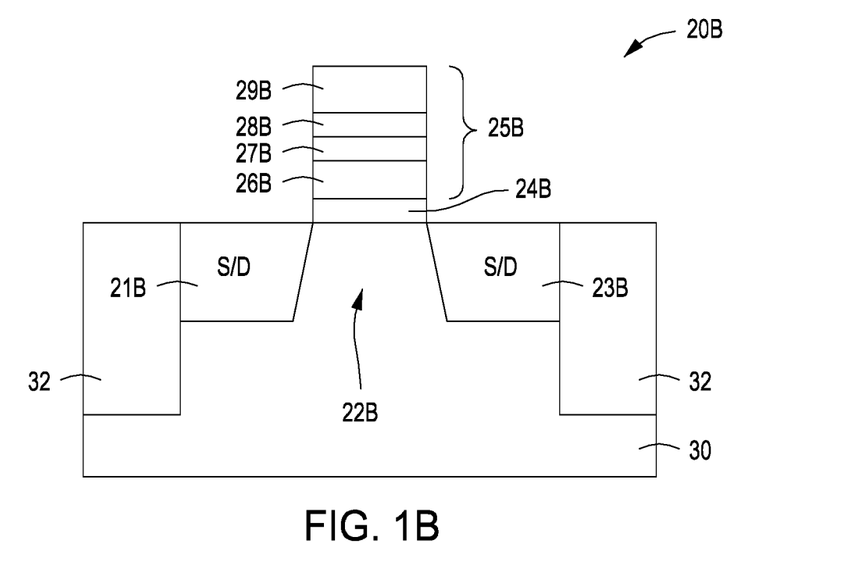
FIG. 1B illustrates a gate electrode stack applicable to the DRAM cell of FIG. 1A, the gate electrode stack including a feature formed by deposition of a low resistivity thin film of tungsten in accordance with one or more embodiments of the present disclosure.

FIG. 1B illustrates an embodiment of a gate electrode stack 25B of a MOS device 20B that may be used in a DRAM type memory cell, such as the selection transistor 20 of FIG. 1A. The semiconductor device such as MOS device 20B is formed on a substrate 30. The substrate may be formed from any type of semiconductor material such as silicon, germanium, etc. The MOS device 20B includes source and drain regions 21B and 23B on the substrate 30. The source and drain regions 21B and 23B may be formed by doping the substrate 30 using conventional doping techniques. The area below the gate electrode stack 25B may be a lightly doped region 22B of the substrate 30, where the dopant has a different conductivity than the dopant used to form the source and drain regions 21B, 23B. Additionally, shallow trench isolation regions 32 may also be formed on the substrate 30.

The gate electrode stack 25B is formed between the source and drain regions 21B and 23B. A gate dielectric layer 24B may be formed on the area of the substrate above the lightly doped region 22B. The gate dielectric layer may be made from various dielectric materials, including high-k dielectric materials, to insulate the gate from the substrate 30.

A conductive film layer 26B is formed on the gate dielectric layer 24B and forms part of the gate electrode stack 25B. The conductive film layer 26B may be polysilicon or other types of conductive films used for gate electrode stacks. In an embodiment, the gate electrode stack 25B further includes a refractory metal nitride film layer 27B on the conductive film layer 26B. Refractory metal nitride films may include titanium nitride (TiN), tungsten nitride (MN), as well as nitrides of other refractory metals such as zirconium, hafnium, tantalum, vanadium, chromium to name a few. The refractory metal film layer may have a thickness from about 50 angstroms (Å) to about 150 Å. In one embodiment, the refractory metal film layer thickness is about 100 Å.

In one embodiment, a silicon-containing film layer 28B is formed on the refractory metal nitride film layer 27B. The silicon-containing film may be a thin film of silicon deposited using various techniques, such as PVD, CVD, and ALD techniques. The silicon-containing film layer may include a dopant, such as boron. In one embodiment, the silicon-containing film layer may be a tungsten silicide film. The silicon-containing film layer may have a thickness of about 10 Å to 30 Å, such as 20 Å. In other embodiments, the silicon-containing film layer 28B depicted in FIG. 1B is omitted.

The gate electrode stack 256 also includes a tungsten film layer 296 on the silicon-containing film layer 28B or, where omitted, on the refractory metal nitride film layer 27B. Tungsten may be in an alpha or beta phase. In one embodiment, the tungsten film layer 29B may be formed in an alpha phase, which helps reduce the resistance of tungsten. The tungsten film layer may have a thickness from about 200 Å to about 500 Å. In some embodiments, the tungsten film layer has a thickness of about 200 Å to about 300 Å. In one embodiment, the tungsten film layer has a resistivity of less than 10 µohms-cm at a thickness of 200 Å, a resistivity of less than 9 µohms-cm at a thickness of 250 Å and a resistivity of about 8.5 µohms-cm at a thickness of 300 Å.

A gate electrode stack formed from WN or WSEN on polysilicon may react with the polysilicon during or after deposition to form an insulating layer between the metal layers and polysilicon. The insulating layer may be especially prone to form during subsequent high temperature processing. Additionally, during WN deposition reactive nitrogen plasma used may react with polysilicon or the native oxide on polysilicon and form silicon nitride (SiN), one type of insulating layer. Additionally, in the case of a W/AN/Ti on poly gate stack. Ti is very reactive and getters oxide on polysilicon, forming TiSiN or $TiO_xN_y$ during subsequent thermal processing. Interposing the silicon-containing film layer 28B between the tungsten film layer 29B and refractory metal nitride film layer 27B may help overcome these drawbacks to other types of gate electrode stacks.

Figure 2:
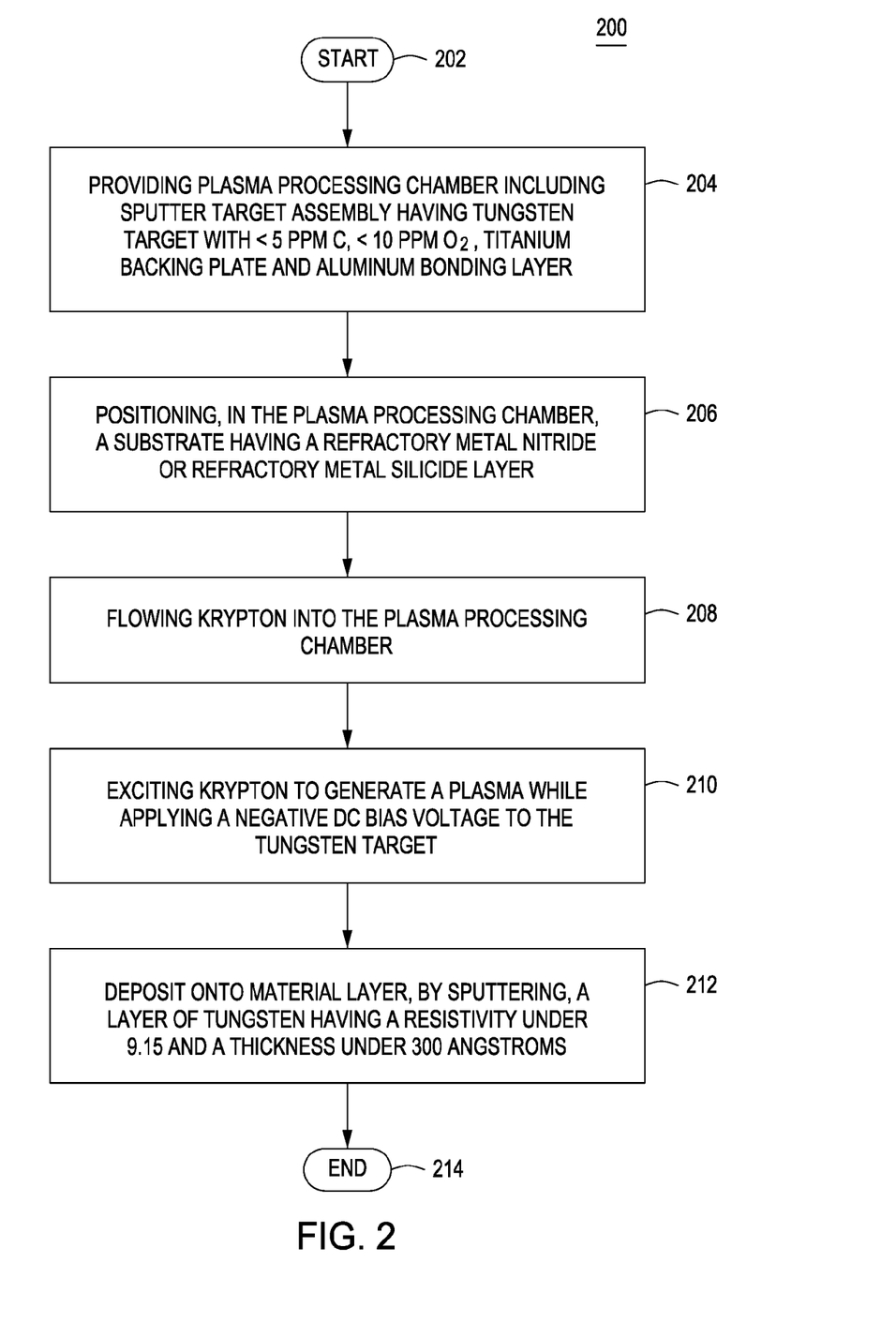
FIG. 2 illustrates a process diagram of a method of forming a feature on a substrate by deposition of a low resistivity thin film of tungsten, according to one or more embodiments of the present disclosure.

FIG. 2 depicts a flow chart illustrating process 200 for forming a gate electrode stack, as described in an embodiment herein. The process 200 is entered at start block 202. The process 200 may include providing a plasma processing chamber including a sputter target assembly having a tungsten target with less than ten parts per million (ppm) carbon (C) and less than ten ppm oxygen ($O_2$) as impurities; as shown in block 204. By minimizing the contribution of the tungsten target as a source of $O_2$ and C contaminants within the plasma processing chamber, the inventors theorize that the deleterious impact of impurity scattering, upon the resistivity of the tungsten film derived by sputtering of the target material, can be significantly reduced.

In embodiments, the density of the tungsten target is between from about 19 to about 19.30 g/cm$^3$, the thickness of the tungsten target is greater than about 500 Å, and the resistivity of the tungsten target is between from about 8.75 to about 9.0 µohms-cm. In embodiments, the relative density of the tungsten target (i.e., as compared the ideal density of pure tungsten) is between from about 99.15 and 99.85 percent and in an embodiment, the relative density of the tungsten target is about 99.70 to about 99.80%.

The process 200 may also include positioning a substrate within the processing chamber, wherein the substrate comprises a source and drain region, a gate dielectric layer between the source and drain regions, and a conductive film layer on the gate dielectric layer, as at block 206. A refractory metal nitride film layer or refractory metal silicide may be formed on the conductive film layer, as at block 206. In some embodiments, the substrate includes a refractory metal nitride film layer upon which is formed a silicon-containing film layer. The process 200 further include flowing krypton gas (Kr) into the plasma processing chamber, as at block 208, exciting the Kr to generate a plasma, as at block 210, and depositing, by sputter deposition of the tungsten target material, a thin film of tungsten having a thickness under 300 Å as at block 212.

In an embodiment of process 200, the Kr is flowed into a plasma processing chamber maintained at a pressure of about a few millitorr (mTorr) at a rate of about a dozen standard cubic centimeters/minute (sccm), a DC power is applied to the target, and an RF bias power is applied to the substrate, to achieve a layer of tungsten having a thickness of about 150-500 Å after about 22.30 seconds.

Figure 3:
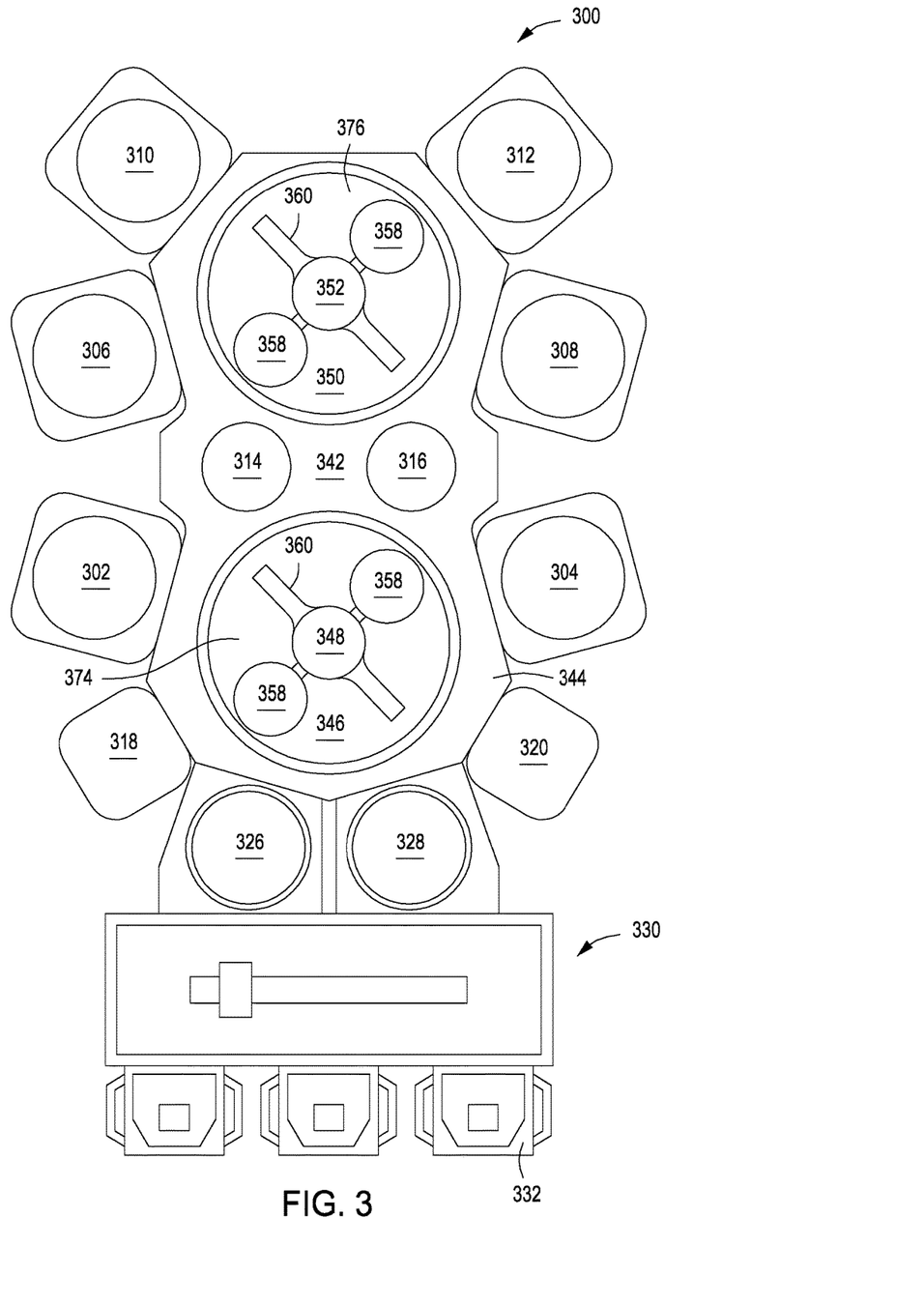
FIG. 3 illustrates a platform system having multiple chambers for forming circuit structures including a feature formed by thin film deposition of tungsten on a substrate, according to one or more embodiments of the present disclosure.

In some embodiments, formation of the refractory metal nitride and/or refractory metal silicide film layer(s), the silicon-containing film layer(s), and the tungsten film layer are formed in-situ, such as in a processing system 300 as illustrated in FIG. 3 and described below. In another embodiment, the films are formed in separate processing systems, where a vacuum break occurs between formation of some of the film layers. In other words, formation of the various films layers may be formed ex-situ. For example, the silicon-containing film may be formed in a different processing system than the tungsten film layer. As such, the silicon-containing film may be exposed to oxygen to form a layer of native oxide, such as $SiO_2$, on the silicon-containing layer. In one embodiment, the native oxide film is removed and the silicon-containing layer cleaned prior to formation of the tungsten film layer.

Formation of circuit structures utilizing thin, low resistivity tungsten films according to embodiments consistent with the present disclosure such, for example, as the gate electrode stack depicted in FIG. 1B may be performed in a processing system, such as the duster tool 300 illustrated FIG. 3. Cluster tool 300 may be a dual buffer chamber, multiple process chamber semiconductor processing tool or dual buffer chamber duster tool. The duster tool 300 may be an Endura® platform having various attached chambers available from Applied Materials, Inc., located in Santa Clara, Calif. Attached to the duster tool 300 may be a factory interface (FI) 330 with one or more FOUPS 332 for handling and transporting substrates from one area of a semiconductor fab to another area. The FI 330 removes substrates 358 from the FOURS 332 to begin the processing sequence. The duster tool 300 has a first buffer chamber 346 and a second buffer chamber 350, and a first substrate transfer location 314 and a second substrate transfer location 316 disposed within a polygonal structure 344. The first buffer chamber 346 may be a low quality vacuum buffer and the second buffer chamber 350 may be a high quality vacuum. The substrate transfer locations may be a chamber.

A first load lock chamber 326 and second load lock chamber 328 may be disposed on the one side of the polygonal structure 344. A first degas chamber 318 and second degas chamber 320 may be disposed on generally opposite sides of the polygonal structure and adjacent the first load lock chamber 326 and second load lock chamber 328. A first pair of process chambers 302 and 304 may be disposed on generally opposite sides of the polygonal structure 344 and adjacent chambers as first degas chamber 318, second degas chamber 320, and first buffer chamber 346. The first pair of process chamber 302, 304 may be a Versa™ W PVD chamber for forming a tungsten film on the substrate, available from Applied Materials, Inc., located in Santa, Clara, Calif. A second pair of process chambers 306 and 308 may be disposed on generally opposite sides of the polygonal structure 344 and adjacent buffer chamber 350. The second pair of process chambers may be an Extensa™ TTN PVD chamber, also available from Applied Materials, Inc., located in Santa Clara, Calif. A third pair of process chambers 310 and 312 may be disposed on generally opposite sides of the polygonal structure 344 and adjacent second pair of process chambers 306, 308 and second buffer chamber 350. The third pair of process chambers may be chambers for depositing the silicon-containing layer, such as $WSi_x$ also available from Applied Materials, Inc., located in Santa Clara, Calif.

Process and load lock chambers may be selectively isolated from the first buffer chamber 346 and second buffer chamber 350 by a plurality of slit valves (not shown) creating a first and second environment, 374 and 376, respectively. The polygonal structure 344 has a central wall 342 which separates first buffer chamber 346 and second buffer chamber 350. The central wall 342 separates the first buffer chamber 346 and second buffer chamber 350. The substrate transfer locations 314 and 316 provide individual passage though the central wall 342 to the first buffer chamber 346 and second buffer chamber 350. The substrate transfer locations 314 and 316 are selectively isolated from adjoining first buffer chamber 346 and second buffer chamber 350 by a plurality of slit valves (not shown). For example, one slit valve may be provided between first buffer chamber 346 and the first substrate transfer location 314, one additional slit valve may be provided between first transfer location 314 and second buffer chamber 350, one slit valve may be provided between first buffer chamber 346 and second substrate transfer location 316 and one slit valve may be provided between second buffer chamber 350 and second substrate transfer location 316. The use of the slit valves allows for the pressure in each chamber to be individually controlled. Each of first substrate transfer location 314 and second substrate transfer location 316 additionally may have a substrate pedestal (not shown), respectively, for supporting a corresponding substrate at each location.

The first buffer chamber 346 is circumscribed by the first load lock chamber 326, second load lock chamber 328, first degas chamber 318, second degas chamber 320, first process chamber 302, second process chamber 304, first substrate transfer location 314 and second substrate transfer location 316. Each of the first and second process chambers 302, 304, first and second degas chambers 318, 320, and the load lock chambers 326, 328 are selectively isolated from the first buffer chamber 346 by a slit valve (not shown). Located within the first buffer chamber 346 is a first robotic substrate transport mechanism 348, e.g., a multi-blade robot. Other types of transport mechanisms may be substituted. The first robotic substrate transport mechanism 348 shown may have substrate transport blades 360 supporting one or more of the substrates 358. The substrate transport blades 360 are used by first robotic substrate transport mechanism 348 for carrying substrates 358 individually to and from chambers circumscribing the first buffer chamber 346.

The second buffer chamber 350 is circumscribed by the process chambers 306, 308, 310 and 312, and first and second substrate transfer locations 314 and 316. Located within the second buffer chamber 350 is a second robotic substrate transport mechanism 352, e.g., a multi-blade robot. Other types of transport mechanisms may be substituted. The second robotic substrate transport mechanism 352 shown may have substrate transport blades 360 supporting one or more of the substrates 358. The substrate transport blade 360 is used by second robotic substrate transport mechanism 352 for carrying the individual substrates to and from chambers circumscribing the second buffer chamber 350.

The buffer chambers 346, 350 may have vacuum ports connected to a pumping/mechanism (not shown) such as a turbo/molecular pump, which is capable of evacuating the environments of first and second buffer chambers 346 and 350. The configuration and location of the vacuum ports may vary dependent on design criteria for individual systems.

Substrate processing, for example, may begin with the first buffer chamber 346 and second buffer chamber 350 being pumped down to a vacuum condition by a pumping mechanism. The first robotic substrate transport mechanism 348 retrieves a substrate 358 from one of the load lock chambers (e.g. 326) and carries that substrate to the first stage of processing, for example, the first degas chamber 318 which may be used to degas the substrate 358 including structures formed thereon in preparation for subsequent processing. For example, the substrate 30 including the conductive film layer 26B of the gate electrode stack 25B may be degassed prior to formation of the remaining layers of the gate electrode.

In a next stage of processing, the substrate may be carried to any of the process chambers 306, 308 to fabricate one or more layers of the substrate positioned according to the process exemplified by block 206. Once the first robotic substrate transport mechanism 348 is no longer carrying a substrate, the first robotic substrate transport mechanism 348 can tend substrates in the other chambers surrounding buffer chamber 346. Once the substrate is processed and PVD stage deposits material upon the substrate, the substrate can then be moved to a second stage of processing, and so on. For example, the substrate may then be moved to any of process chambers 310, 312 to perform process 206 as described above.

If a processing chamber is located adjacent to second buffer chamber 350, the substrate may be transported into one of the substrate transfer locations (e.g. first substrate transfer location 314). The slit valve separating buffer chamber 346 and first substrate transfer location 314 is opened. The first robotic substrate transport mechanism 348 transports the substrate into the first substrate transfer location 314. The substrate transport blade 360 connected to first robotic substrate transport mechanism 348 is removed from first substrate transfer location 314 leaving the substrate on the pedestal. After the slit valve separating the first buffer chamber 346 and the first substrate transfer location 314 is closed, a second slit valve separating the second buffer chamber 350 and the first substrate transfer location 314 is opened, allowing the substrate transport blade 360 connected to the second robotic substrate transport mechanism 352 to be inserted into first substrate transfer location 314 to retrieve the substrate. Once the substrate is inside second buffer chamber 350, the second slit valve is closed and the second robotic substrate transport mechanism 352 is free to move the substrate to an appropriate processing chamber or sequence of chambers serviced by second buffer chamber 350 and second robotic substrate transport mechanism 352.

After substrate processing terminates, the substrate is loaded into one of the FOUPS 332 on the FI 330, moving the substrate back through the substrate transfer location as appropriate.

Figure 4A:
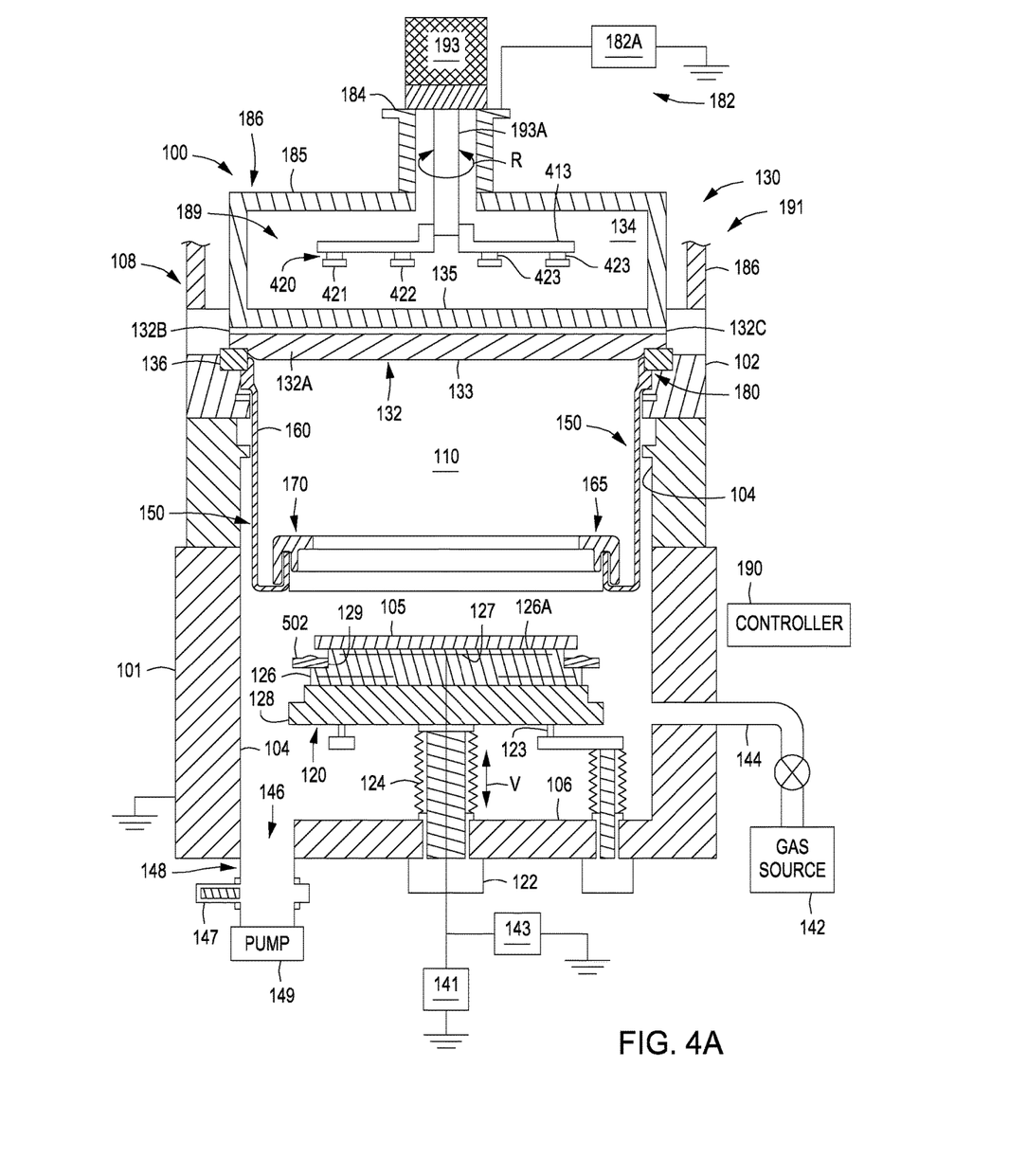
FIG. 4A illustrates a cross-sectional view of a plasma processing chamber according to an embodiment of the present disclosure.

During the process exemplified by block 212 as described above, the tungsten film may be formed using various methods. Reference to FIGS. 4A-7 may be used to illustrate the process. In one embodiment, the method for forming the tungsten film includes forming a plasma in a processing region 110 of a plasma processing chamber (e.g., chamber 100) using a direct current (DC) power supply 182 coupled to a target assembly 132 that includes a tungsten target (target 132A), an aluminum bonding layer 132B, and a titanium backing plate 132O, in the chamber 100. The tungsten target 132A has a first surface 133 that is in contact with the processing region 110 of the chamber 100 and a second surface 135 that is opposite the first surface 133. Energy is delivered to a plasma formed in a processing region 110 of a chamber from DC power supply 182 to the target 132A. The DC power may be applied to the tungsten target at a power level within the range from about 500 W to about 3.0 kW, such as about 1.5 kW or 2.0 kW. In some embodiments, the process of forming a thin tungsten film having low resistivity may use only a DC power source coupled to the tungsten target (target 132A) along with an RF bias coupled to a substrate support. However, although FIG. 4A shows only a DC power source coupled to the target, the chamber may have both an RF and a DC power source coupled to the tungsten target in some embodiments.

In embodiments, a magnetron system 189 may rotate about the center point of the target 132A, wherein the magnetron system 189 is disposed adjacent the second surface 135 of the target 132A. The magnetron system 189 may include an outer pole 424 comprising a plurality of magnets 423 and an inner pole 425 comprising a plurality of magnets 423. The outer and inner poles 424, 425 may form a closed-loop magnetron assembly. The magnetron system and resulting magnetic fields affect the bombardment of the Krypton (Kr) ions during the deposition process, and enables control of the thin film properties such as grain size and film density, in one embodiment, the chamber 100 is a short throw chamber where the spacing between the target and the substrate is from a range between 55 mm and 75 mm, for example 73 mm or 65 mm. In embodiments, the plasma is ignited with Kr. In one embodiment, the plasma may be generated from a Kr gas having a flow rate within a range from about 10 to about 15 sccm.

The process may also include heating the substrate support 126 in the chamber. The substrate support 126, or substrate disposed thereon, may be heated to a temperature within a range from about 100° C. to about 400° C. In one embodiment the substrate or support may be heated to a temperature within a range from about 150° C. to about 400° C. For example, the substrate or substrate support may be heated to 200° C., 250° C., 300° C., or even 400° C.

The inventors herein have observed that a DC power only physical vapor deposition process produces low energy tungsten species, and that tungsten films grown with low energy species tend to be sufficiently porous as to allow high energy particles to penetrate the tungsten films. To exploit the porosity phenomenon, embodiments of the process exemplified at block 210 apply an RF bias to the substrate support (and substrate) via an RF power supply. The RF bias may have a power level within a range from about 100 W to about 1200 W. In one embodiment, the RF bias may have a power level within a range from about 200 W to about 400 W and is applied at a frequency of 13.5 MHz RF.

Applying the RF bias power increases the on energy, enabling high energy particles to penetrate the tungsten film, remain a few atomic planes under the film surface, and densify the film. Such penetration may modulate film stress from tensile to compressive, and may fill vacancies in the film to reduce film resistivity though the latter effect may be offset by the creation of interstitial point defects. The RF bias also helps to control bombardment of the ions on the substrate, beneficially affecting the thin film properties such as grain size, film density, and other properties. RF bias provides extra kinetic energy to the bombarding ions, which may prompt large grain growth.

By using the various variables described above, a tungsten film may be deposited on a substrate 105 positioned on the substrate support 126 in the chamber 100. Moreover, by controlling the deposition pressure and temperature, the DC power and RF bias and by using a target assembly that includes a very low impurity and high density tungsten target bonded to a titanium backing plate by an aluminum interlayer, a tungsten film on the order of 300 Å thick may be formed having a resistance of about 8.5 μohms-cm, while a tungsten film on the order of 250 Å thick may be formed having a resistance of about 9 μohms-cm or even less (e.g., down to about 8.95 μohms-cm).

Further, ion bombardment in accordance with embodiments consistent with the present disclosure may also be improved using a magnetron assembly having imbalanced ratios within a certain range, and particularly when the imbalanced ratio has a greater magnetic field strength on the inner magnetic loop compared to the outer magnetic loop. Additionally, the thickness uniformity is improved by adjusting the magnetron imbalanced ratio. Improved on bombardment may also provide less trapping or incorporation of Kr, $O_2$, etc. into the thin film; which also reduces the resistivity of the thin tungsten film.

FIG. 4A illustrates an exemplary plasma processing chamber (chamber 100) having an upper process assembly 108, a process kit 150 and a pedestal assembly 120, which may be configured to process a substrate 105 disposed in a processing region 110. The chamber 100 may be a tungsten PVD deposition chamber such as process chamber 302 or 304 on duster tool 300 shown in FIG. 3. The process kit 150 includes a one-piece grounded shield 160; a lower process kit 165, and an isolator ring assembly 180. In the version shown, the chamber 100 comprises a sputtering chamber, also called a physical vapor deposition or PVD chamber, capable of depositing a single material from target 132A onto the substrate 105. The chamber 100 may also be used to deposit tungsten. The inventors herein contemplate that other processing chambers including those from other manufacturers may be adapted to benefit from one or more of the embodiments of the present disclosure.

The chamber 100 includes a chamber body 101 having sidewalls 104, a bottom wall 106, and an upper process assembly 108 that enclose a processing region 110 or plasma zone. The chamber body 101 is typically fabricated from welded plates of stainless steel or a unitary block of aluminum. In one embodiment, the sidewalls comprise aluminum and the bottom wall comprises stainless steel plate. The sidewalls 104 generally contain a slit valve (not shown) to provide for entry and egress of a substrate 105 from the chamber 100. Components in the upper process assembly 108 of the chamber 100 in cooperation with the grounded shield 160, pedestal assembly 120 and cover ring 170 confine the plasma formed in the processing region 110 to the region above the substrate 105.

A pedestal assembly 120 is supported from the bottom wall 106 of the chamber 100. The pedestal assembly 120 supports a deposition ring 502 along with the substrate 105 during processing. The pedestal assembly 120 is coupled to the bottom wall 106 of the chamber 100 by a lift mechanism 122, which is configured to move the pedestal assembly 120 between an upper processing position and lower transfer position. Additionally, in the lower transfer position, lift pins 123 are moved through the pedestal assembly 120 to position the substrate a distance from the pedestal assembly 120 to facilitate the exchange of the substrate with a substrate transfer mechanism disposed exterior to the chamber 100, such as a single blade robot (not shown). A bellows 124 is typically disposed between the pedestal assembly 120 and the bottom wall 106 to isolate the processing region 110 from the interior of the pedestal assembly 120 and the exterior of the chamber.

The pedestal assembly 120 generally includes a substrate support 126 sealingly coupled to a platform housing 128. The platform housing 128 is typically fabricated from a metallic material such as stainless steel or aluminum. A cooling plate (not shown) is generally disposed within the platform housing 128 to thermally regulate the substrate support 126.

The substrate support 126 may be comprised of aluminum or ceramic. The substrate support 126 has a substrate receiving surface 126A that receives and supports the substrate 105 during processing, the substrate receiving surface 126A being substantially parallel to a sputtering surface (e.g. first surface 133) of the target 132A of target assembly 132. The substrate support 126 also has a peripheral edge 129 that terminates before an overhanging edge of the substrate 105. The substrate support 126 may be an electrostatic chuck, a ceramic body, a heater or a combination thereof. In one embodiment; the substrate support 126 is an electrostatic chuck that includes a dielectric body having an electrode (e.g., a conductive layer 127), embedded therein. The dielectric body is typically fabricated from a high thermal conductivity dielectric; material such as pyrolytic boron nitride, aluminum nitride, silicon nitride, alumina or an equivalent material. Other aspects of the pedestal assembly 120 and support 126 are further described below. In one embodiment, the conductive layer 127 is configured so that when a DC voltage is applied to the conductive layer 127, by an electrostatic chuck power supply 143, a substrate 105 disposed on the substrate receiving surface 126A will be electrostatically chucked thereto to improve the heat transfer between the substrate 105 and the substrate support 126. In another embodiment, an RF bias controller 141 is also coupled to the conductive layer 127 so that a voltage can be maintained on the substrate during processing to affect the plasma interaction with the surface of the substrate 105.

The chamber 100 is controlled by a system controller 190 that is generally designed to facilitate the control and automation of the chamber 100 and typically includes a central processing unit (CPU) (not shown), memory (not shown), and support circuits (or I/O) (not shown). The CPU may be any form of computer processor used in industrial settings for controlling various system functions, substrate movement, chamber processes, and support hardware (e.g., sensors, robots, motors, etc.), and monitor the processes (e.g., substrate support temperature, power supply variables, chamber process time, I/O signals, etc.). The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, dock circuits, input/output circuitry, subsystems, and the like. A program (or computer instructions) readable by the system controller 190 determines which tasks are performable on a substrate. In embodiments, the program is software readable by the system controller 190 that includes code to perform tasks relating to monitoring, execution and control of the movement and various process recipe tasks and recipe processes being performed in the chamber 100. For example, the system controller 190 can comprise program code that includes a substrate positioning instruction set to operate the pedestal assembly 120; a gas flow control instruction set to operate gas flow control valves to set a flow of sputtering gas to the chamber 100; a gas pressure control instruction set to operate a throttle valve or gate valve to maintain a pressure in the chamber 100; a temperature control instruction set to control a temperature control system (not shown) in the pedestal assembly 120 or sidewalls 104 to set temperatures of the substrate or sidewalls 104, respectively; and a process monitoring instruction set to monitor the process in the chamber 100.

The chamber 100 also contains a process kit 150 which comprises various components that can be easily removed from the chamber 100, for example, to clean sputtering deposits off the component surfaces, replace or repair eroded components, or to adapt the chamber 100 for other processes. In one embodiment, the process kit 150 comprises an isolator ring assembly 180, a grounded shield 160 and a ring assembly 168 for placement about a peripheral edge 129 of the substrate support 126 that terminates before an overhanging edge of the substrate 105.

Figure 4B:
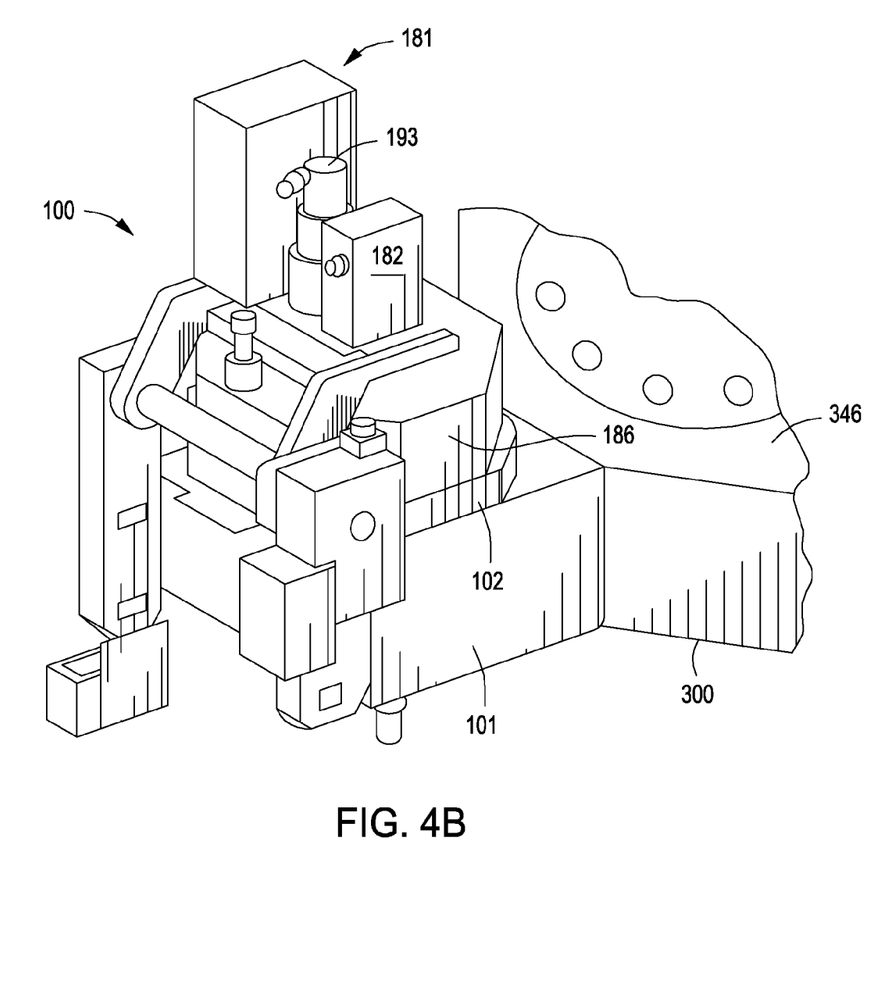
FIG. 4B depicts an isometric view of a chamber according to an embodiment of the present disclosure.

FIG. 4B is an isometric view of the chamber 100 that is coupled to a processing position of a duster tool 300. The duster tool 300 may also contain other processing chambers such as shown in FIG. 3 that are adapted to perform one or more processing operations on a substrate prior to or after performing the deposition process in the chamber 100. An exemplary duster tool 300 may include a Centura® or an Endure® system available from Applied Materials Inc., Santa Clara, Calif., In one example, the duster tool 300 may have processing chambers that are configured to perform a number of substrate processing operations such as cyclical layer deposition, chemical vapor deposition (CVD), physical vapor deposition (PVD), atomic layer deposition (ALD), etch, pre-clean, degas, anneal, orientation and other substrate processes. A transfer tool, for example, a first robotic substrate transport mechanism 348 disposed in the first buffer chamber 346, may be used to transfer substrates to and from one or more chambers attached to the duster tool 300.

The upper process assembly 108 may also comprise an RF power supply 181, DC power supply 182, an adaptor 102, a motor 193, and a lid assembly 130. The lid assembly 130 generally comprises a target assembly 132 having a tungsten target (target 132A) bonded to a titanium backing plate 132C by an aluminum diffusion bonding interlayer (aluminum bonding layer 132B), a magnetron system 189 and a lid enclosure 191. The upper process assembly 108 is supported by the sidewalls 104 when in a closed position, as shown in FIGS. 4A and 4B. A ceramic target isolator 136 is disposed between the isolator ring assembly 180, the target assembly 132 and adaptor 102 of the lid assembly 130 to prevent vacuum leakage therebetween. The adaptor 102 is sealably coupled to the sidewalls 104, and is configured to help with the removal of the upper process assembly 108 and isolator ring assembly 180.

When in the processing position, the target 132A is disposed adjacent to the adaptor 102, and is exposed to the processing region 110 of the chamber 100. The tungsten from which target 132A is formed is deposited on the substrate 105 during a PVD, or sputtering, process. The isolator ring assembly 180 is disposed between the target 132A and the shield 160 and chamber body 101 to electrically isolate the target 132A from the shield 160 and chamber body 101.

During processing, the target 132A is biased relative to a grounded region of the processing chamber (e.g., chamber body 101 and adaptor 102) by a power source disposed in the DC power supply 182. In one embodiment, the DC power source 182A in the DC power supply 182 is capable of delivering between about 0 and about 9.0 kW of DC power.

During processing, a high atomic weight, non-reactive gas is supplied to the processing region 110 from a gas source 142 via conduits 144. The gas source 142 may comprise a non-reactive gas such as krypton or xenon, which is capable of energetically impinging upon and sputtering material from the target 132A. The gas source 142 may also include a reactive gas, such as a nitrogen-containing gas, which is capable of reacting with the sputtering material to form a layer on a substrate. Spent process gas and byproducts are exhausted from the chamber 100 through exhaust ports 146 that receive spent process gas and direct the spent process gas to an exhaust conduit 148 having an adjustable position gate valve 147 to control the pressure in the processing region 110 in the chamber 100. The exhaust conduit 148 is connected to one or more exhaust pump 149, such as a cryopump. Typically, the pressure of the sputtering gas in the chamber 100 during processing is set to sub-atmospheric levels, such as a vacuum environment, for example, a pressure of about 1.0 mTorr to about 10.0 mTorr. In one embodiment, the processing pressure is set to about 2.5 mTorr to about 6.5 mTorr. A plasma is formed between the substrate 105 and the target 132A from the gas. Ions within the plasma are accelerated toward the target 132A and cause material to become dislodged from the target 132A. The dislodged target material is deposited on the substrate.

The lid enclosure 191 generally comprises a conductive wall 185, a center feed 184 and shielding 186 (FIGS. 4A and 4B). In the configuration depicted, the conductive wall 185, the center feed 184, the target 132A and a portion of the motor 193 enclose and form a back region 134. The back region 134 is a sealed region disposed on the back side of the target 132A and is generally filled with a flowing liquid during processing to remove the heat generated at the target 132A during processing. In one embodiment, the conductive wall 185 and center feed 184 are configured to support the motor 193 and magnetron system 189, so that the motor 193 can rotate the magnetron system 189 during processing. In one embodiment the motor 193 is electrically isolated from the DC power delivered from the DC power supply by use of a dielectric layer such as Delrin, G10, or Ardel.

The shielding 186 may comprise one or more dielectric materials that are positioned to enclose and prevent the energy delivered to the target 132A from interfering with and affecting other processing chambers disposed in the cluster tool 103 (FIG. 4B). In one configuration, the shielding 186 may comprise a Delrin, G10, Ardel or other similar material and/or a thin grounded sheet metal RF shield.

In one embodiment of the chamber 100, an RF bias controller 141 (FIG. 4A) is coupled between an electrode and RF ground to adjust the bias voltage on the substrate during processing to control the degree of bombardment on the substrate surface. In one embodiment, the electrode is disposed adjacent to the substrate receiving surface 126A of a substrate support 126, and comprises the electrode (e.g., conductive layer 127). In a PVD reactor, tuning of the bombardment of the substrate surface by the control of the impedance of the electrode to ground, will affect the deposited film's properties, such as grain size, film stress, crystal orientation, film density, roughness and film composition. As such, the RF bias controller 141 can be used to after the film properties at the substrate surface. In an embodiment, the RF bias controller 141 has an RF power source (not shown) and an RF match (not shown). The RF bias power set point can depend on the applicable processing results to be achieved on the substrate.

Figure 5:
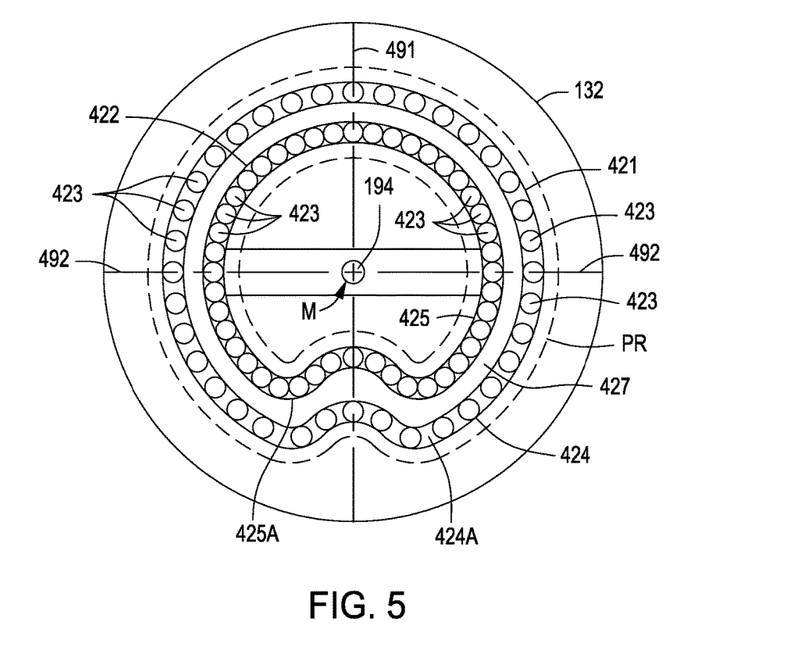
FIG. 5 depicts a top view of a portion of a magnetron for use in forming a feature on a substrate by deposition of a low resistivity thin film of tungsten, according to one or more embodiments of the present disclosure.

FIG. 5 depicts a top view of a portion of a first embodiment of a magnetron for use in forming a feature on a substrate by deposition of a low resistivity thin film of tungsten, according to one or more embodiments of the present disclosure. According to one embodiment of the present disclosure as understood by reference to FIGS. 4A and 5, the magnetron system 189 includes a source magnetron assembly 420 that comprises a rotation plate 413, an outer pole 424 and an inner pole 425. The rotation plate 413 generally allows the positioning of the magnetic field generating components in the source magnetron assembly 420 to be moved relative to the central axis 194 of the chamber 100.

The rotation plate 413 is generally adapted to support and magnetically couple the outer pole 424 of a first magnetic polarity in the vertical direction and the inner pole 425 having a second magnetic polarity opposite to that of the first magnetic polarity. The outer pole 424 is separated from the inner pole 425 by a gap 427, and each of the poles generally comprises one or more magnets and a pole piece (outer pole piece 421, inner pole piece 422). The magnetic field extending between the outer pole 424 and inner pole 425 creates a plasma region adjacent a first portion of the sputtering face of the target 132A. The plasma region forms a high density plasma region that generally follows the shape of the gap 427.

Figure 7:
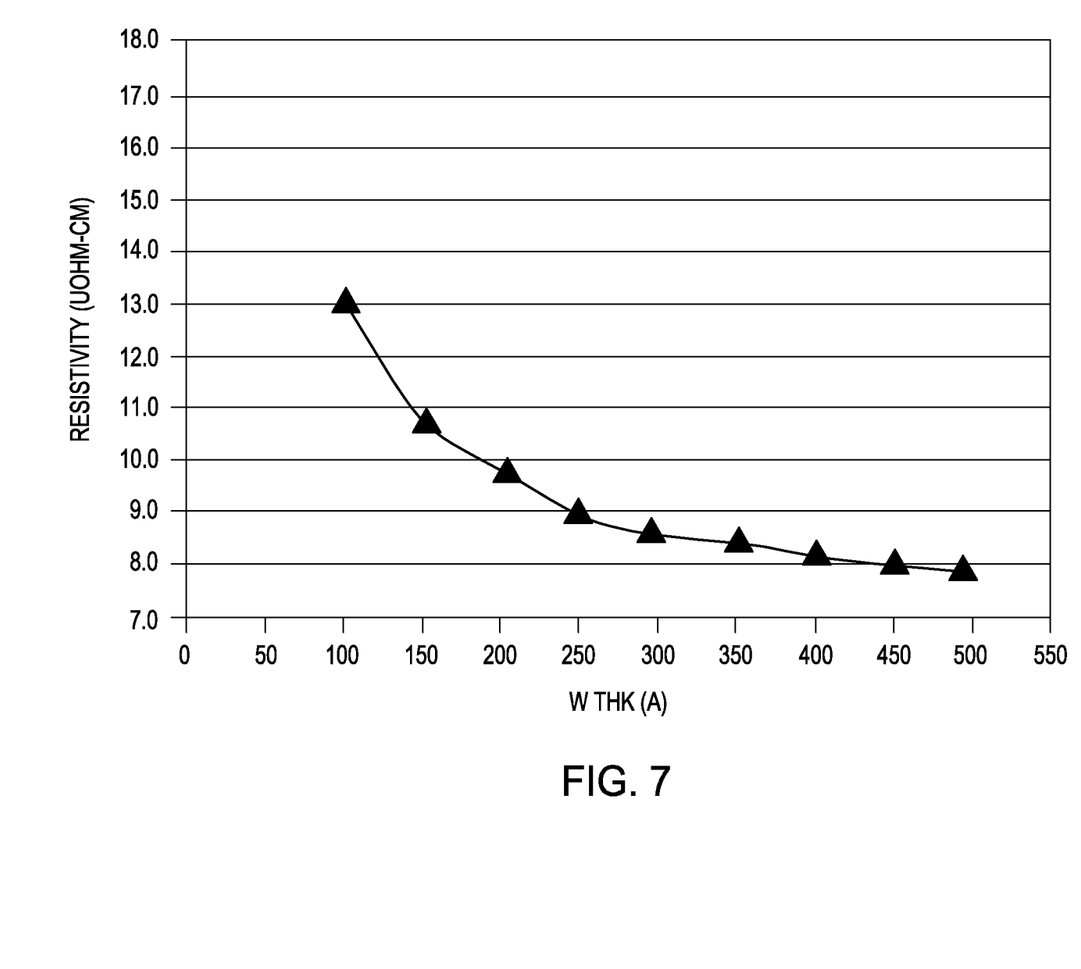
FIG. 7 is a graphical representation depicting the relationship between resistivity and thickness of a thin film tungsten layer obtained by sputtering according to embodiments consistent with the present disclosure.

In the exemplary embodiment shown in FIG. 7, the magnetron system 189 is a closed loop design. In general; a "closed loop" magnetron configuration is formed such that the outer pole of the magnetron surrounds the inner pole of the magnetron forming a gap between the poles that is a continuous loop. In the closed loop configuration; the magnetic fields that emerge and reenter through a surface of the target form a "closed loop" pattern that can be used to confine electrons near the surface of the target in a closed pattern, which is often called a "racetrack" type pattern. A closed loop, as opposed to the open-loop, magnetron configuration is able to confine electrons and generate a high density plasma near the first surface 133 of the target 132A to increase the sputtering yield.

In one embodiment of the magnetron system 189, a rotary shaft 193A powered by the motor 193 extends along a central axis 194 and supports the rotation plate 413 and the source magnetron assembly 420. During processing, sputtering significantly heats the target 132A. Accordingly, a back region 134 is sealed to the back of the target 132A and is filled with a liquid of cooling water, which is chilled by a chiller (not shown) and water piping recirculating the cooling water (not shown). The rotary shaft 193A penetrates the chamber 100 through a rotary seal (not shown). The magnetron system 189 is immersed in the liquid disposed in the back region 134.

In some embodiments, the source magnetron assembly 420 is an imbalanced magnetron. Typically, the imbalance is defined as the ratio of the total magnetic intensity or magnetic flux integrated over the outer pole 424 divided by the total magnetic intensity or magnetic flux integrated over the inner pole 425. The inventors herein have observed that by keeping the outer to inner field strength imbalance between about 1.56 and about 0.57, the deposition process of tungsten films can be improved to increase bombardment and grain size. In one embodiment, the outer to inner field strength imbalance is a ratio of between about 1.15 and about 0.93. The magnetic imbalance causes part of the magnetic field emanating from the inner pole 425 to project towards the substrate 105 and guide ionized sputter particles to the substrate 105. However, the source magnetron assembly 420 will create a plasma that causes a sizable fraction of the sputtered particles to be ionized. The ionized particles are at least partially guided towards the substrate 105 by the imbalanced magnetic field, improving film thickness uniformity.

Figure 6:
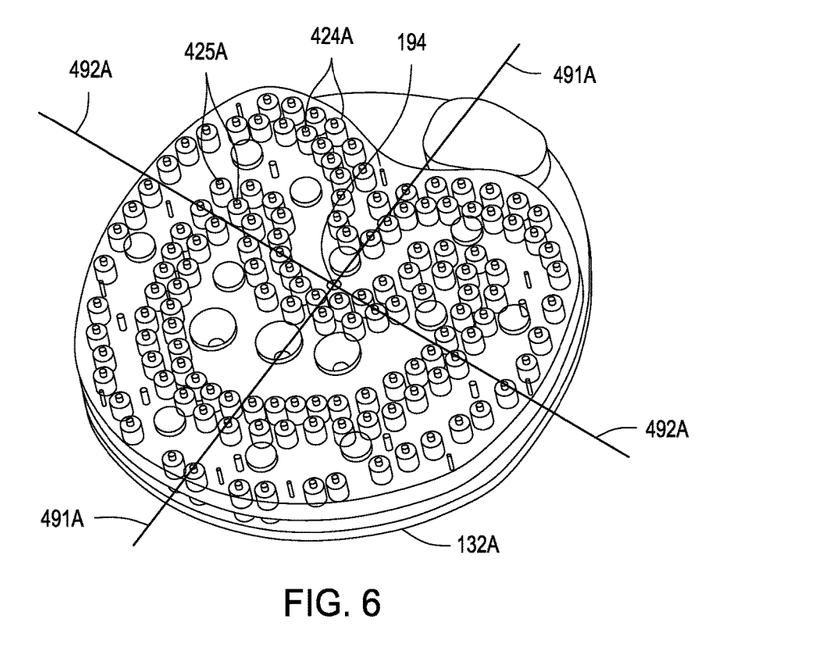
FIG. 6 depicts a top view of a portion of an alternate magnetron for use in forming a feature on a substrate by deposition of a low resistivity thin film of tungsten, according to one or more embodiments of the present disclosure.

In the exemplary embodiment of FIG. 5, an embodiment of the magnetron system 189 is depicted in which an outer pole 424 and an inner pole 425 form a closed loop ring magnetron that is centered about the center "M" of the target 132A. FIG. 6 depicts a top view of a portion of an alternate magnetron for use in forming a feature on a substrate by deposition of a low resistivity thin film of tungsten, according to one or more embodiments of the present disclosure. In the embodiment of FIG. 6, the inner pole 425A includes a dual concentric array of magnets, while the outer pole 424A includes some regions having only a single array of magnets and other regions comprising a dual array.

In each of the exemplary embodiments of FIGS. 5 and 6, the plasma density will generally be higher in the processing region adjacent to a region of the magnetron system 189 above the second axis 492 (FIG. 5) or 492A (FIG. 6), or region having the highest density of magnets, versus a region having the lowest density of magnets, or no magnets in some embodiments. The first axis 491 (FIG. 5) or 491A (FIG. 6) is orthogonal to the second axis 492 or 492A, respectively. The magnetron spins on a generally central axis above the target and the chamber, and thus in one embodiment is configured to be rotated about the geometric center "M" by the motor 193 during processing.

FIG. 7 is a graphical representation depicting the relationship between resistivity and thickness of an illustrative thin film tungsten layer obtained by sputtering according to embodiments consistent with the present disclosure. The results depicted in FIG. 7 are illustrative and not to be construed as limiting the scope of the present disclosure.

While the foregoing is directed to embodiments of the present disclosure, other and further embodiments consistent with the present disclosure may be devised without departing from the basic scope thereof.

The invention claimed is:

1. A method of sputter depositing a tungsten structure in an integrated circuit, comprising:
moving a substrate into a plasma processing chamber and onto a substrate support in opposition to a sputter target assembly comprising a tungsten target having no more than ten parts per million of carbon and no more than ten parts per million of oxygen present as impurities;
flowing krypton into the plasma processing chamber; and
exciting the krypton into a plasma to deposit, by sputtering, a tungsten film layer on a material layer of a substrate supported by the substrate support, wherein the tungsten film layer has a resistivity of less than about 9.0 μohm-cm at a thickness of from about 250 to about 300 angstroms (Å).

2. The method of claim 1, wherein the sputter target assembly further includes a backing plate coupled to the tungsten target.

3. The method of claim 2, wherein the backing plate is a titanium backing plate.

4. The method of claim 3, wherein the sputter target assembly further includes an aluminum bonding layer disposed between the titanium backing plate and tungsten target.

5. The method of claim 1, wherein the tungsten target has a thickness of at least 500 angstroms (Å).

6. The method of claim 1, wherein the tungsten film layer has a thickness of about 250 angstroms (Å).

7. The method of claim 1, wherein the exciting comprises delivering biasing RF power from an RF power supply to the substrate and delivering DC power from a DC power source to the tungsten target.

8. The method of claim 1, wherein the material layer comprises tungsten nitride or tungsten silicide.

9. A method of sputter depositing a tungsten structure in an integrated circuit, comprising:
moving a substrate into a plasma processing chamber and onto a substrate support in opposition to a sputter target assembly comprising a tungsten target and a backing plate coupled to the tungsten target, the tungsten target having no more than ten parts per million of carbon and no more than ten parts per million of oxygen present as impurities, wherein the tungsten target has a resistivity of about 8.75 to about 9.0 μohm-cm;
flowing krypton into the plasma processing chamber; and
exciting the krypton into a plasma to deposit, by sputtering, a tungsten film layer on a material layer of a substrate supported by the substrate support.

10. A method of sputter depositing a tungsten structure in an integrated circuit, comprising:
moving a substrate into a plasma processing chamber and onto a substrate support in opposition to a sputter target assembly comprising a tungsten target having no more than ten parts per million of carbon and no more than ten parts per million of oxygen present as impurities, wherein the tungsten target has a density of from about 19 to about 19.35 g/cm$^3$ and a resistivity of about 8.75 to about 9.0 ρohm-cm;
flowing krypton into the plasma processing chamber; and
exciting the krypton into a plasma to deposit, by sputtering, a tungsten film layer on a material layer of a substrate supported by the substrate support.

11. The method of claim 10, wherein the tungsten target has a thickness of at least 500 angstroms (Å).

* * * * *

UNITED STATES PATENT AND TRADEMARK OFFICE
CERTIFICATE OF CORRECTION

PATENT NO. : 10,043,670 B2
APPLICATION NO. : 14/981190
DATED : August 7, 2018
INVENTOR(S) : Ramalingam et al.

Page 1 of 1

It is certified that error appears in the above-identified patent and that said Letters Patent is hereby corrected as shown below:

Column 1, Line 30, delete "on bombardment" and substitute therefor --ion bombardment--.

Column 4, Line 41, delete "tungsten nitride MN" and substitute therefor --tungsten nitride WN--.

Column 4, Line 58, delete "stack 256 also" and substitute therefor --stack 25B also--.

Column 4, Line 59, delete "layer 296 on" and substitute therefor --layer 29B on--.

Signed and Sealed this
Eighteenth Day of September, 2018

Andrei Iancu
*Director of the United States Patent and Trademark Office*